US011480598B1

(12) United States Patent
Conroy et al.

(10) Patent No.: US 11,480,598 B1
(45) Date of Patent: Oct. 25, 2022

(54) REDUCED FOOTPRINT SSD WITH TEST STATION FOR AN UNDERGROUND PIPELINE

(71) Applicant: Ark Engineering & Technical Services Inc., Braintree, MA (US)

(72) Inventors: Michael Conroy, Lakes Wales, FL (US); Robert Allen, Moultonborough, NH (US)

(73) Assignee: Ark Engineering & Technical Services Inc., Braintree, MA (US)

( * ) Notice: Subject to any disclaimer, the term of this patent is extended or adjusted under 35 U.S.C. 154(b) by 0 days.

(21) Appl. No.: 17/728,001

(22) Filed: Apr. 25, 2022

Related U.S. Application Data

(60) Provisional application No. 63/180,125, filed on Apr. 27, 2021.

(51) Int. Cl.
*G01R 27/28* (2006.01)
*G01R 31/00* (2006.01)
(Continued)

(52) U.S. Cl.
CPC ......... *G01R 31/002* (2013.01); *G01N 17/006* (2013.01); *G01R 1/0416* (2013.01);
(Continued)

(58) Field of Classification Search
CPC .. G01R 31/002; G01R 1/0416; G01R 31/001; G01R 29/0814; G01N 17/006;
(Continued)

(56) References Cited

U.S. PATENT DOCUMENTS 6,965,320 B1   11/2005 Casey
2006/0203411 A1   9/2006 Fourie
(Continued)

FOREIGN PATENT DOCUMENTS

EP      0882975 A1   12/1998

OTHER PUBLICATIONS

International Search Report and Written Opinion for PCT Appl. No. PCT/US2022/025987 dated Aug. 9, 2022, 9 pages.
(Continued)

*Primary Examiner* — Raul J Rios Russo
(74) *Attorney, Agent, or Firm* — Maine Cernota & Rardin

(57) ABSTRACT

A pipeline AC mitigation SSD Marker Station has a shape and land surface area footprint that are similar to conventional pipeline location markers or corrosion test stations. The SSD Marker Station includes an SSD device that connects an underground metallic pipeline to an underground grounding conductor. The SSD Marker Station further includes a disconnect switch configured to disconnect the SSD device from the pipeline and/or grounding conductor. Also included is a pair of testing ports that are in electrical communication with the SSD device. Testing of the SSD device thereby requires only operating the disconnect switch to isolate the SSD device from the pipeline and/or grounding connector and performing an electrical measurement across the testing ports. In embodiments, the SSD Marker Station meets all requirements applicable to a pipeline location marker, and can be installed in lieu of a pipeline location marker.

7 Claims, 4 Drawing Sheets

(51) Int. Cl.
*G01N 17/00* (2006.01)
*G01R 1/04* (2006.01)
*G01R 29/08* (2006.01)
*G01N 17/04* (2006.01)
*H04B 3/487* (2015.01)
*H04B 3/46* (2015.01)
*H04B 3/32* (2006.01)

(52) U.S. Cl.
CPC ....... *G01R 29/0814* (2013.01); *G01R 31/001* (2013.01); *G01N 17/04* (2013.01); *H04B 3/32* (2013.01); *H04B 3/46* (2013.01); *H04B 3/487* (2015.01)

(58) Field of Classification Search
CPC .......... G01N 17/04; H04B 3/487; H04B 3/46; H04B 3/32
USPC ... 324/76.11–76.83, 459, 600, 612, 627, 628
See application file for complete search history.

(56) References Cited

U.S. PATENT DOCUMENTS

| | | |
|---|---|---|
| 2011/0238347 A1 | 9/2011 | Gemperli |
| 2015/0092855 A1* | 4/2015 | Chou .................. H04N 19/147 375/240.16 |
| 2019/0050295 A1* | 2/2019 | Ding ................... G06F 13/4221 |
| 2020/0249844 A1* | 8/2020 | Poupet ................ G06F 3/0643 |

OTHER PUBLICATIONS

Hosokawa Y. et al., New CP Criteria for Elimination of the Risks of AC Corrosion and Overprotection on Cathodically Protected Pipelines, Corrosion 2002, Apr. 7, 2002, pp. 02111/1-02111/12.

* cited by examiner

REDUCED FOOTPRINT SSD WITH TEST STATION FOR AN UNDERGROUND PIPELINE

RELATED APPLICATIONS

This application claims the benefit of U.S. Provisional Application No. 63/180,125, filed Apr. 27, 2021, which is herein incorporated by reference in its entirety for all purposes.

FIELD OF THE INVENTION

The invention relates to metallic underground pipelines, and more particularly, to systems that provide AC mitigation to reduce AC electrical interference effects from electric circuits in proximity to underground metallic pipelines and other underground metallic structures.

BACKGROUND OF THE INVENTION

Metallic pipelines, which are most commonly steel pipelines, are widely used to transport liquids and gases over large distances. Applications of pipelines include the transport of crude and refined petroleum, fuels, such as oil, natural gas and biofuels, as well as other fluids such as water, sewage, slurry, and even beer.

Due to the fact that naturally occurring salts are typically present in the soil and "surface water" adjacent to an underground pipeline, a buried metallic pipeline is susceptible to corrosion due to galvanic oxidation resulting from an interaction between the pipeline and negatively charged chlorine atoms that are present in the soil. In the case of steel pipelines, the galvanic oxidation takes the form of rusting and/or loss of the pipeline metal.

As a primary defense against galvanic oxidation, some sort of coating is typically applied to underground pipelines in an attempt to minimize contact between the metal of the pipeline and the surrounding soil. However, it is impossible to fully prevent contact between a buried pipeline and surrounding soils due to imperfections in the coating or coating degradation over time.

As a second line of defense, underground metallic pipelines often implement a cathodic protection system. According to this approach, the metal of the metallic pipeline is connected to an "anode" that is configured to be at a lower electrical potential as compared to the pipeline, thereby causing a flow of electrons into the pipeline, which acts as the "cathode" of the circuit. This "direct current" (DC) flow of electrons terminates in the soil surrounding the pipeline, and functions to drive the negatively charged chlorine atoms away from the pipeline, thereby further reducing corrosion. At the same time, chlorine ions are attracted to the anode due to the DC flow of electrons out of the anode, thereby sacrificially corroding the metal of the anode as it protects the metal of the pipeline.

The cathodic protection system can be passive ("galvanic" cathodic protection), whereby the anode is formed from a metal that has a natural electrical potential that is lower than the electrical potential of the pipeline. Or the cathodic protection system can be active ("impressed current" cathodic protection), wherein a DC power supply, which is typically an AC electrical source in combination with a rectifier, is used to drive the flow of electrons from the anode to the pipeline.

For either type of cathodic protection system, it is required that grade level or above-ground cathodic protection test stations be installed along the route of the pipeline that can be used to monitor the proper functioning of the cathodic protection. In addition, it is typically mandated that above ground pipeline location markers also be placed along the route of the underground pipeline, so as to prevent third-party excavation damage to a buried pipeline due to a lack of awareness as to presence and location of the pipeline. The corrosion test stations and/or location markers typically extend about three feet above grade. As such, they can be easily damaged by animals, or if vegetation is left uncontrolled and brush cutting is undertaken along the right-of-way. One approach to avoiding such damage is to surround the location markers and corrosion test stations with a cattle guard or fencing.

It is becoming more prevalent to permit the routing of metallic underground pipelines along an easement or "right-of-way" (ROW) in parallel with or crossing suspended high-power electrical transmission lines. Due to the alternating current (AC) transmission of electric power in these power lines, they emit an "electromagnetic field" (EMF) into the surrounding environment. Often, the metallic underground pipeline is subject to these EMF effects, which can cause pipeline integrity issues, personnel safety issues, damage to pipeline monitoring electrical equipment, and/or AC induced corrosion effects. Furthermore, if there is an abnormal occurrence on the electric circuit, this can result in a circuit fault condition, that can lead to electrical arcing through the surrounding soil and additional damage to the pipeline coating.

Accordingly, a so-called "AC mitigation system" is often implemented along a metallic pipeline so as to reduce or eliminate these AC interference effects along the pipeline due to EMF generated by nearby high-power transmission circuits. One common approach is to bury a grounding conductor, typically made from copper or zinc, in proximity to the underground pipeline and running parallel to it for a specified distance. The grounding conductor can also include grounding rods, or AC grounding wells. Electrical connections are provided at specified locations and intervals between the underground pipeline and the grounding conductor, thereby reducing or eliminating these EMF-induced AC interference effects.

If an AC mitigation system is required on a specific section of pipeline that is also cathodically protected, the metallic underground pipeline cannot be directly connected to the grounding conductor, because this would shunt the cathodic protection DC current to the grounding conductor, and thereby reducing the ability of the cathodic protection system to inhibit corrosion in that pipeline section.

Instead, in these areas, the underground metallic pipeline is connected to the grounding conductor by a series of DC decoupling devices more commonly known as "solid state decouplers" (SSDs). The SSDs are designed with a high-valued capacitor in the connection circuit between the pipeline and the grounding conductor, thereby functioning as a good conductor of the EMF-induced AC current (at 50 or 60 Hz) while blocking the DC cathodic protection current from reaching the grounding conductor. Typically, these SSD devices are mounted in a pedestal unit, a below grade vault, or on a post or other support near the pipeline connection point.

Testing of an SSD device typically includes measuring the AC voltage and AC current drain from the pipeline to the grounding conductor. This requires temporarily disconnecting at least one of the cables that connect the SSD to the pipeline and to the grounding conductor. For this reason, the SSD device must be mounted in a configuration that enables a technician to access the SSD terminals. Typically, disconnecting one of the cables can require removing a nut from a bolt to release the terminal lug and cable, so that it can be pulled away, or actuating an optional mechanical disconnect switch installed next to the SSD device. Either method of disconnection can represent a shock hazard to the technician who is testing the SSD, and typically requires following a written company procedure for safety that includes the use of insulating gloves.

FIG. 1 illustrates a typical configuration in the prior art of an underground metallic pipeline (100) and a parallel, proximate grounding conductor (102) buried beneath grade. Suspended high power electrical transmission circuits (104) share the ROW with the pipeline (100) and grounding conductor (102), such that the pipeline (100) is subjected to EMF effects from the electric circuits (104). Galvanic corrosion of the pipeline (100) is inhibited by a cathodic protection system that includes above-ground corrosion test stations (106) installed along the route of the pipeline (100). In addition, location markers (108) are installed along the route of the pipeline (100), and also an AC mitigation system that includes SSD DC decouplers (110).

The ROWs through which underground metallic pipelines (100) are routed are often governed by easements that apply to privately owned land. Typically, the landowner is required by the easement to allow placement of the mandated location markers (108) and corrosion test stations (106) along the route of the pipeline (100). However, in a significant number of instances the easements do not require that the landowner also allow installation of above-ground SSD devices on pedestals or on posts (110), and many property owners object to these additional installations of above-ground SSD devices (110) along the route. Such objections can be based on a perceived unsightliness of the SSD devices (110), tripping hazards to people and animals, and other various reasons. As a result, renegotiation of easement agreements with landowners along the ROW is often required. This process can be time consuming, and may require additional remuneration to the landowners, so as to obtain their permission to place the required above-ground SSD devices (110) on their land.

What is needed, therefore, is an above ground SSD device that will give rise to minimal objections by land owners along the right of way of an underground metallic pipeline.

SUMMARY OF THE INVENTION

The present invention is an integrated SSD device and above ground pipeline marker having an above-ground profile that is similar in dimensions and appearance to conventional pipeline location markers and/or corrosion test stations. Embodiments are able to serve a dual purpose of SSD device and location marker, and can therefore be installed in place of mandated location markers. Depending on the terms of an easement, the disclosed SSD test station may avoid any need to re-negotiate the easement. And in cases where an easement renegotiation remains necessary, the disclosed SSD device will generally give rise to minimal objections by landowners.

In embodiments, the disclosed SSD device is a marker station that comprises a vertical SSD tube within which the SSD capacitor is installed. SSD cables extend downward below grade from the SSD tube to a metallic underground pipeline and to a grounding conductor. At least one of the SSD cables is routed through a disconnection switch that is provided on an above-ground test panel of the SSD. The disconnection switch is thereby operable to temporarily disconnect the SSD capacitor from the pipeline and/or the grounding conductor. Also provided on the SSD test panel are a pair of testing ports that are connected to the two (2) terminals of the SSD device. After the SSD device has been disconnected using the switch, the SSD device can be discharged by shorting together the two testing ports, after which the functionality of the SSD capacitor can be tested by applying a measurement device (for example an Ohmmeter) across the testing ports.

Including a disconnection switch and testing ports on the SSD test panel, rather than requiring a technician to physically access the SSD cables, enables the disclosed SSD device to be configured such that it is installed inside a conventional pipeline location marker or corrosion test station. The disconnection switch and testing ports also enable disconnection, testing, and reconnection of the SSD device to be performed without manual disconnection of the SSD cables, and without exposing a technician to any potential shock hazards. A lockable cover panel can be provided that will prevent unauthorized access to the disconnection switch.

In some embodiments, the vertical tube of the SSD Marker Station has an outer diameter that is less than 4.5 inches, and in some of these embodiments the diameter of the vertical tube is equal to or less than 4 inches, and thereby presents a land surface area "footprint" that is only about 6% as large as a typical SSD pedestal installation of the prior art.

In some embodiments, the disclosed SSD Marker Station is comparable in size and shape to a conventional corrosion test station, while in other embodiments the SSD Marker Station is comparable in size and shape to a conventional pipeline location marker. In some of these embodiments, the disclosed SSD Marker Station includes required warning markings and/or any other required features of a pipeline marker, such that the disclosed SSD Marker Station can be installed in place of a pipeline marker, and can serve as both a pipeline marker and an SSD device, thereby avoiding any need to renegotiate easements.

In summary, embodiments of the disclosed invention provide a decreased SSD device footprint as compared with conventional SSD pedestals, reduce or eliminate any need to renegotiate easements, function in some embodiments as location markers as well as SSD's, decrease the time required to test the SSD, eliminate potential technician shock hazards associated with SSD testing, and provide a more esthetic appearance as compared to conventional SSD installations.

The present invention is a solid state disconnect (SSD) comprising a hollow vertical tube having an outer diameter of no more than 4.5 inches, an SSD device installed within the vertical tube, a disconnect switch provided on an above-ground SSD test panel of the SSD, the disconnect switch being switchable between an operating configuration and a testing configuration, a plurality of SSD cables interconnecting the SSD device with the disconnect switch, with a metallic underground pipeline, and with an underground grounding conductor, wherein when the disconnect switch is in the operating configuration, the SSD device functions as an AC mitigation device by providing AC conductivity between the underground pipeline and the underground grounding conductor, while blocking DC conductivity between the underground pipeline and the underground grounding conductor, and wherein when the disconnect switch is in the testing configuration, the SSD device is disconnected from at least one of the underground pipeline and the underground grounding conductor, thereby interrupting the AC conductivity between the underground pipeline and the underground grounding conductor.

Embodiments further include a lockable cover panel that is configured to prevent unauthorized access to the disconnect switch.

Any of the above embodiments can further include comprising a pair of testing ports provided on the SSD test panel, the testing ports being in electrical connection with respective terminals of the SSD device. Some of these embodiments further include a lockable cover panel that is configured to prevent unauthorized access to the testing ports. In any of these embodiments, when the disconnect switch is in the operating configuration, the testing ports can be disconnected from electrical communication with the terminals of the SSD capacitor.

In any of the above embodiments, the SSD can further include visible indicia that are similar or identical to indicia that are applied to a conventional pipeline location marker or pipeline corrosion test station.

And in any of the above embodiments, the SSD can be configured to satisfy all applicable requirements for a pipeline location marker, thereby enabling the SSD Marker Station to function simultaneously as a pipeline location marker and as an AC mitigation device.

The features and advantages described herein are not all-inclusive and, in particular, many additional features and advantages will be apparent to one of ordinary skill in the art in view of the drawings, specification, and claims. Moreover, it should be noted that the language used in the specification has been principally selected for readability and instructional purposes, and not to limit the scope of the inventive subject matter.

DETAILED DESCRIPTION

Figure 2A:
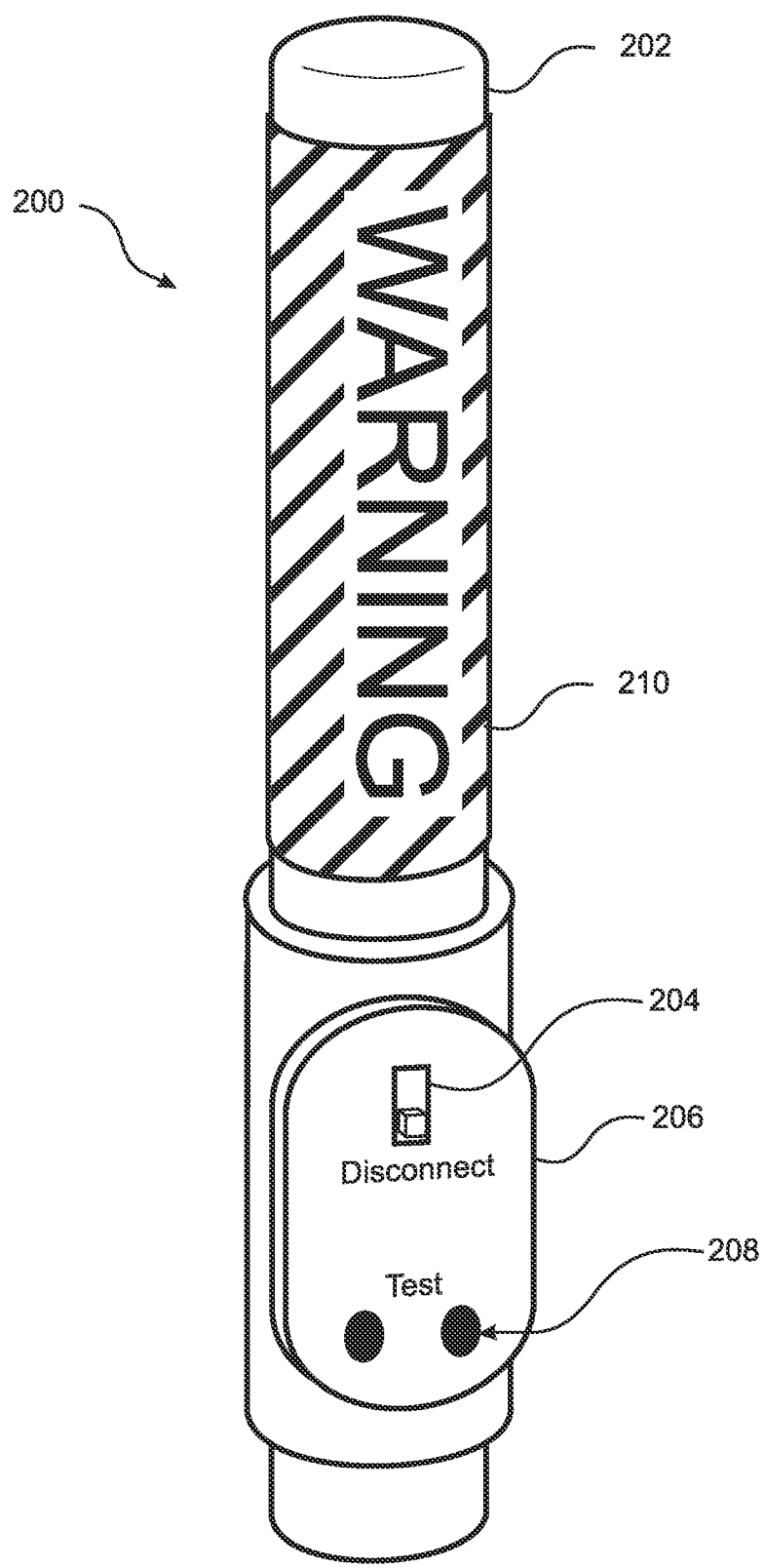
FIG. 2A is a perspective view of an embodiment of the present invention.
Figure 2B:
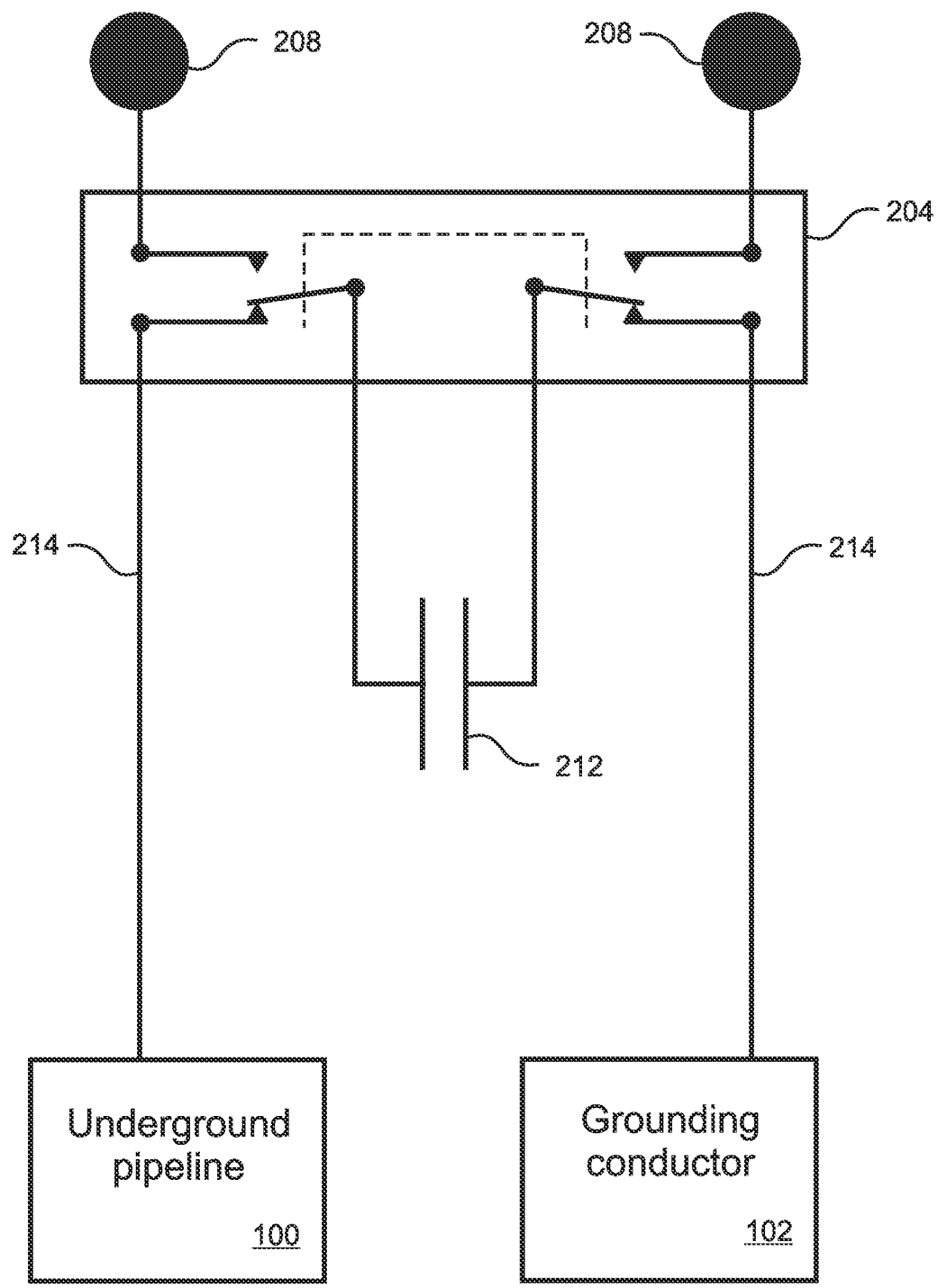
FIG. 2B is a simplified diagram that illustrates the electrical circuit of an embodiment of the present invention.

With reference to the perspective view of FIG. 2A and the simplified circuit diagram of FIG. 2B, the present invention is an integrated SSD and above ground pipeline marker or corrosion test station (referred to herein collectively as the "SSD Marker Station" or simply the "SSD") (200) having an above-ground profile that is similar in dimensions and appearance to conventional location markers (108) and/or corrosion test stations (106). The illustrated embodiment is able to serve a dual purpose of SSD test station and location marker and can therefore be installed in place of mandated location markers (108). Depending on the terms of an easement, the disclosed SSD Marker Station (200) may avoid any need to re-negotiate the easement. And even if an easement renegotiation remains necessary, the disclosed SSD Marker Station (200) will generally give rise to minimal objections by landowners.

In the embodiment of FIGS. 2A and 2B, the disclosed SSD Marker Station (200) comprises a vertical tube (202) within which the SSD device (212) is contained. SSD cables (214) extend below grade from the SSD device (212) to a metallic underground pipeline (100) and grounding conductor (102). At least one of the SSD cables (214) is routed through a disconnect switch (204) that is provided on an above-ground test panel (206) of the SSD device (200). The disconnect switch (204) is thereby operable to temporarily disconnect the SSD device (212) from the pipeline (100) and/or the grounding conductor (102). In the embodiment of FIG. 2B, both of the SSD cables (214) are routed through the disconnect switch (204), such that the disconnect switch (204) is able to disconnect the SSD device (212) from both the underground pipeline (100) and the grounding conductor (102).

Also provided on the SSD test panel (206) are a pair of testing ports (208) that extend to the two terminals of the SSD device (212). In the embodiment of FIG. 2B, the disconnect switch is a double-pole, double-throw switch that connects the terminals of the SSD device (212) to the underground pipeline (100) and grounding connector (102) when the disconnect switch (204) is in an operating configuration, or to the test ports (208) when the disconnect switch (204) is in a testing configuration, but never to both at the same time.

After the SSD device (212) has been disconnected from the underground pipeline (100) and/or grounding conductor (102) by the disconnect switch (204), the SSD device can be discharged by shorting together the two testing ports (208), after which the functionality of the SSD device (212) can be tested by applying a measurement device (for example an Ohmmeter) across the testing ports (208).

Including a disconnect switch (204) and testing ports (208) on the SSD test panel (206), rather than requiring a technician to physically access the SSD cables (214), enables the disclosed SSD Marker Station 200 to be reduced in diameter, such that it is approximately the same diameter as a conventional location marker (108) or corrosion test station (106). The implementation of the disconnect switch (204) and testing ports (208) also enable disconnection, testing, and reconnection of the SSD device (212) to be performed without manual disconnection of any SSD cables (214), and without exposing a technician to any potential shock hazards. A lockable cover panel (not shown) can be provided that will prevent unauthorized access to the disconnect switch (204) and testing ports (208). In embodiments, the cover panel can be locked in place using a padlock.

In some embodiments, the vertical tube (202) of the SSD Marker Station (200) has an outer diameter that is less than 4.5 inches, and in some of these embodiments the diameter of the vertical tube (202) is equal to or less than 4 inches, and thereby presents a land surface area "footprint" that is only about 6% as large as a typical SSD pedestal installation (110) of the prior art, which would have a land surface area of about 1.63 ft$^2$.

In some embodiments, the disclosed SSD Marker Station is comparable in size and shape to a conventional corrosion test station (106). In the embodiment of FIG. 2A, the SSD Marker Station is comparable in size and shape to a conventional pipeline location marker (108). In the illustrated embodiment, the disclosed SSD Marker Station (200) includes required warning markings (210) and/or any other required features of a pipeline location marker (108), such that the disclosed SSD Marker Station can be installed in place of a pipeline marker (108), and can serve as both a pipeline location marker and an SSD device, thereby reducing the number of required above-ground elements and avoiding any need to renegotiate easements.

Figure 1:
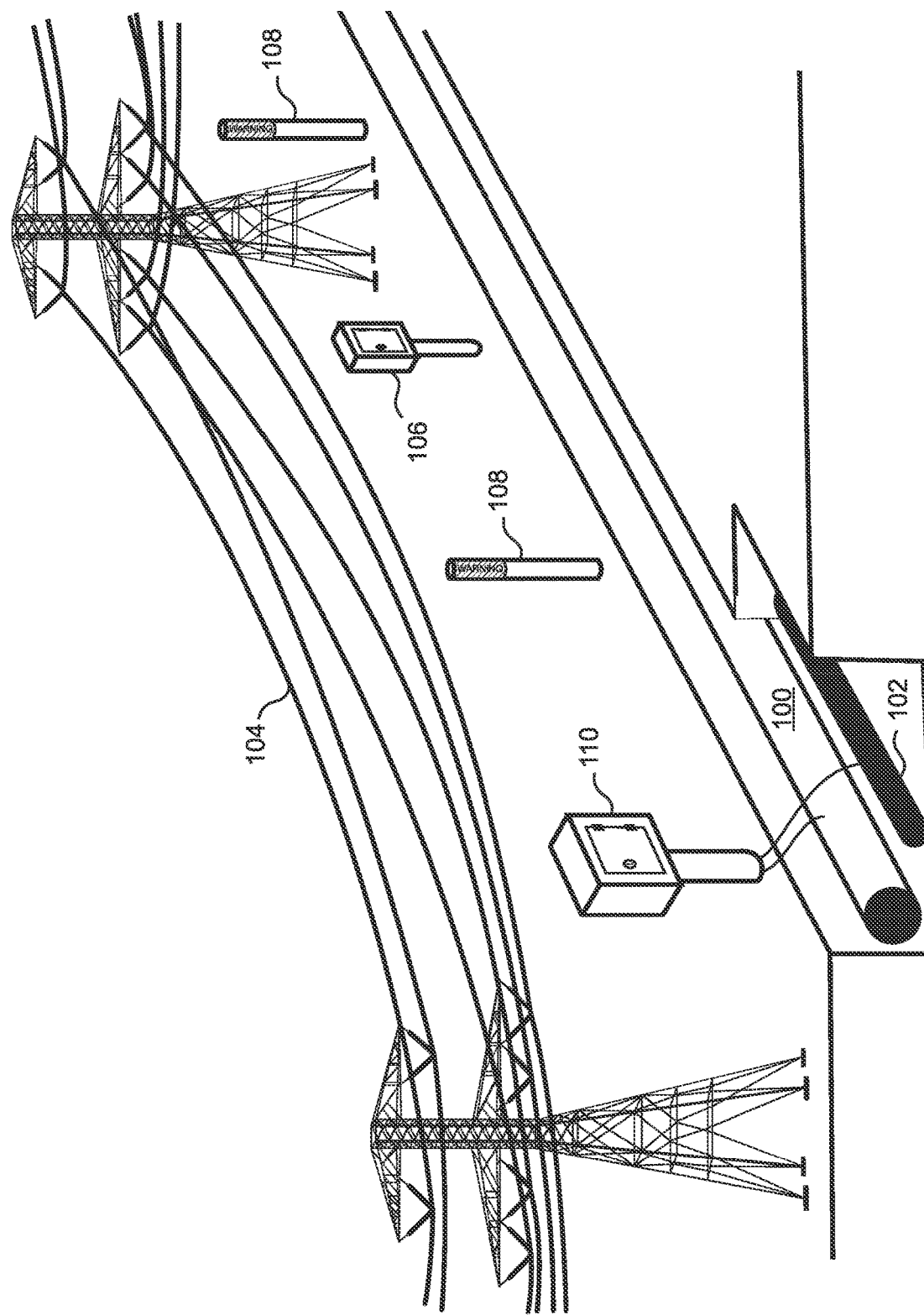
FIG. 1 is a perspective view of a metallic underground pipeline and associated pipeline location markers, cathodic protection system, and AC mitigation system according to the prior art, the pipeline being proximate to above ground suspended high power electrical transmission lines.
Figure 3:
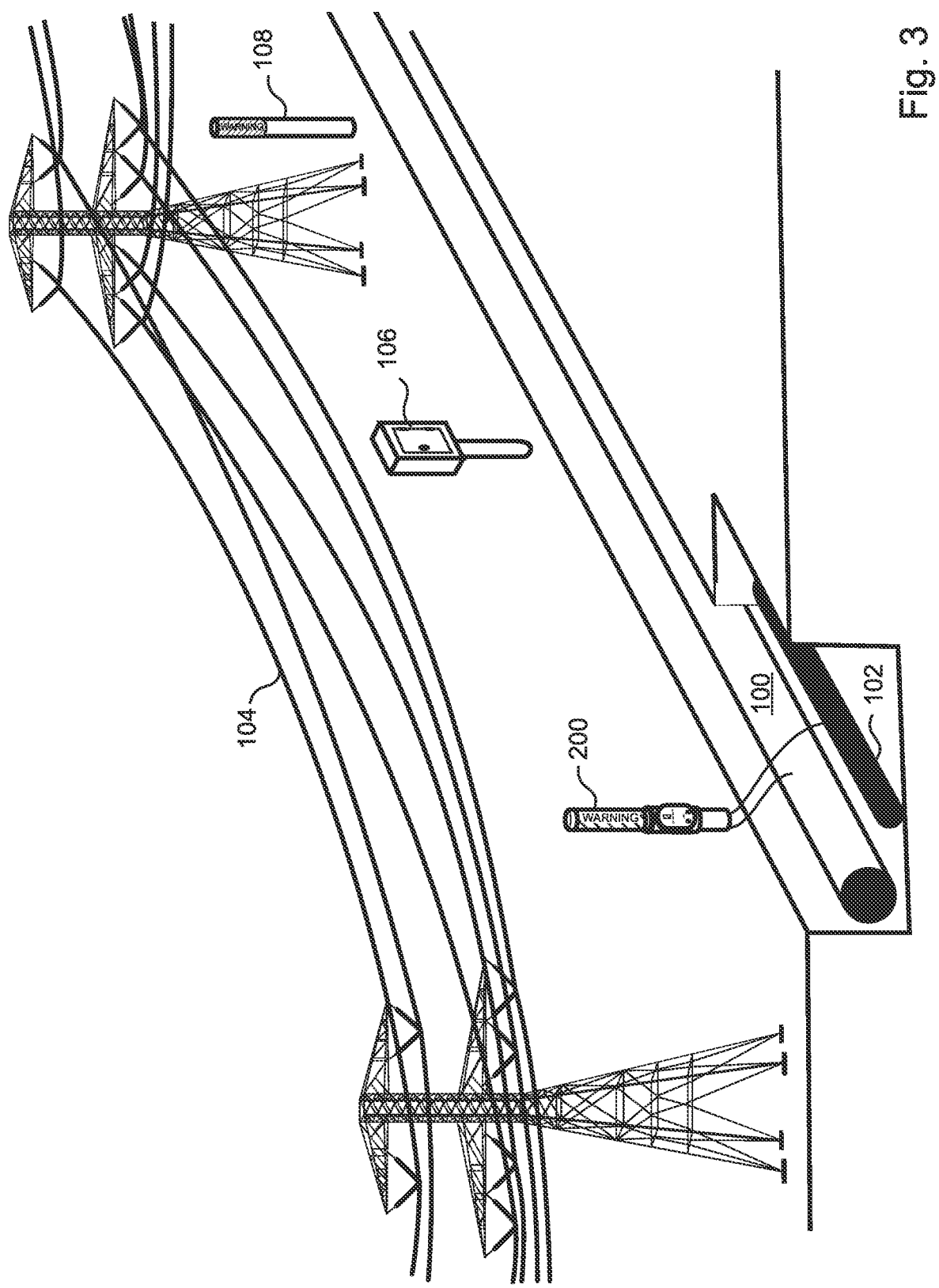
FIG. 3 is a perspective view similar to FIG. 1, but wherein an embodiment of the present invention has been installed in lieu of a pipeline location marker.

FIG. 3 illustrates deployment of an embodiment 200 of the present invention. In the figure, the novel SSD Marker Station (200) takes the place of a conventional location marker (108), such that only three (3) above-ground elements (200), (106), (108) are required, rather than the four (4) above ground elements (106), (108), (110) of FIG. 1.

In summary, embodiments of the disclosed invention provide a decreased SSD footprint as compared with conventional SSD pedestals, reduce or eliminates any need to renegotiate easements, function in some embodiments as location markers as well as SSDs, decrease the time required to test the SSD, eliminate technician potential shock hazards associated with SSD testing, and provide a more esthetic appearance as compared to conventional SSDs.

The foregoing description of the embodiments of the invention has been presented for the purposes of illustration and description. Each and every page of this submission, and all contents thereon, however characterized, identified, or numbered, is considered a substantive part of this application for all purposes, irrespective of form or placement within the application. This specification is not intended to be exhaustive or to limit the invention to the precise form disclosed. Many modifications and variations are possible in light of this disclosure.

Although the present application is shown in a limited number of forms, the scope of the invention is not limited to just these forms but is amenable to various changes and modifications. The disclosure presented herein does not explicitly disclose all possible combinations of features that fall within the scope of the invention. The features disclosed herein for the various embodiments can generally be interchanged and combined into any combinations that are not self-contradictory without departing from the scope of the invention. In particular, the limitations presented in dependent claims below can be combined with their corresponding independent claims in any number and in any order without departing from the scope of this disclosure, unless the dependent claims are logically incompatible with each other.

We claim:

1. A solid state disconnect (SSD) comprising:
   a hollow vertical tube having an outer diameter of no more than 4.5 inches;
   an SSD device installed within the hollow vertical tube;
   a disconnect switch provided on an above-ground SSD test panel of the SSD, the disconnect switch being switchable between an operating configuration and a testing configuration;
   a plurality of SSD cables interconnecting the SSD device with the disconnect switch, with a metallic underground pipeline, and with an underground grounding conductor;
   wherein when the disconnect switch is in the operating configuration, the SSD device functions as an AC mitigation device by providing AC conductivity between the underground pipeline and the underground grounding conductor, while blocking DC conductivity between the underground pipeline and the underground grounding conductor; and wherein when the disconnect switch is in the testing configuration, the SSD device is disconnected from at least one of the underground pipeline and the underground grounding conductor, thereby interrupting the AC conductivity between the underground pipeline and the underground grounding conductor.

2. The SSD of claim 1, further comprising a lockable cover panel that is configured to prevent unauthorized access to the disconnect switch.

3. The SSD of claim 1, further comprising a pair of testing ports provided on the SSD test panel, the testing ports being in electrical connection with respective terminals of the SSD device.

4. The SSD of claim 3, further comprising a lockable cover panel that is configured to prevent unauthorized access to the testing ports.

5. The SSD of claim 3, wherein when the disconnect switch is in the operating configuration, the testing ports are not in electrical communication with the terminals of the SSD capacitor.

6. The SSD of claim 1, wherein the SSD further comprises visible indicia that are similar or identical to indicia that are applied to a conventional pipeline location marker or pipeline corrosion test station.

7. The SSD of claim 1, wherein the SSD is configured to satisfy all applicable requirements for a pipeline location marker, thereby enabling the SSD Marker Station to function simultaneously as a pipeline location marker and as an AC mitigation device.

* * * * *